(12) United States Patent
Okubo et al.

(10) Patent No.: US 9,952,497 B2
(45) Date of Patent: Apr. 24, 2018

(54) MASK BLANK AND METHOD OF MANUFACTURING PHASE SHIFT MASK

(71) Applicant: HOYA CORPORATION, Shinjuku-ku, Tokyo (JP)

(72) Inventors: Yasushi Okubo, Tokyo (JP); Ryo Ohkubo, Tokyo (JP)

(73) Assignee: HOYA CORPORATION, Shinjuku-ku, Tokyo (JP)

(*) Notice: Subject to any disclaimer, the term of this patent is extended or adjusted under 35 U.S.C. 154(b) by 37 days.

(21) Appl. No.: 15/286,635

(22) Filed: Oct. 6, 2016

(65) Prior Publication Data

US 2017/0023856 A1    Jan. 26, 2017

Related U.S. Application Data

(62) Division of application No. 14/414,357, filed as application No. PCT/JP2013/067371 on Jun. 25, 2013, now Pat. No. 9,494,852.

(30) Foreign Application Priority Data

Jul. 13, 2012  (JP) .................................. 2012-157588

(51) Int. Cl.
    *G03F 1/26* (2012.01)
    *G03F 1/80* (2012.01)
    *G03F 1/54* (2012.01)

(52) U.S. Cl.
    CPC .................. *G03F 1/26* (2013.01); *G03F 1/54* (2013.01); *G03F 1/80* (2013.01)

(58) Field of Classification Search
    None
    See application file for complete search history.

(56) References Cited

U.S. PATENT DOCUMENTS 7,625,677 B2   12/2009  Yoshikawa et al.
8,475,978 B2    7/2013  Yoshikawa et al.
(Continued)

FOREIGN PATENT DOCUMENTS

JP    5-232678 A    9/1993
JP    7-134389 A    5/1995
(Continued)

OTHER PUBLICATIONS

International Search Report for PCT/JP2013/067371 dated Aug. 20, 2013 [PCT/ISA/210].
(Continued)

*Primary Examiner* — Stephen Rosasco
(74) *Attorney, Agent, or Firm* — Sughrue Mion, PLLC

(57) ABSTRACT

A mask blank suitable for fabricating a phase shift mask having a thin film pattern composed of a material enabling dry etching with a fluorine-based gas and a substrate-engraved pattern. The mask blank 100 is used to fabricate a phase shift mask having a thin film pattern and a substrate-engraved pattern. The mask blank 100 has a structure in which an etching stopper film 2, a thin film for pattern formation 3 and an etching mask film 4 are laminated in this order on a transparent substrate 1. The etching stopper film 2 is made of a material that contains chromium and oxygen and the oxygen content thereof is more than 50 at %. The thin film 3 is made of a material that can be dry-etched by a fluorine-based gas. The etching mask film 4 is made of a material that contains chromium, the chromium content thereof is not less than 45 at %, and the oxygen content thereof is not more than 30 at %.

16 Claims, 3 Drawing Sheets

(56) References Cited

U.S. PATENT DOCUMENTS

| 2005/0217988 A1 | 10/2005 | Yoshikawa et al. |
| 2007/0248897 A1 | 10/2007 | Yoshikawa et al. |
| 2009/0057143 A1 | 3/2009 | Yoshikawa et al. |
| 2010/0081066 A1 | 4/2010 | Nozawa |
| 2010/0261101 A1 | 10/2010 | Yoshikawa et al. |

FOREIGN PATENT DOCUMENTS

| JP | 9-34099 A | 2/1997 |
| JP | 2002-287330 A | 10/2002 |
| JP | 2005284216 A | 10/2005 |
| JP | 2006-215297 A | 8/2006 |
| JP | 2007-241065 A | 9/2007 |
| JP | 2007-292824 A | 11/2007 |
| JP | 2011-112982 A | 1/2010 |
| JP | 2010-79110 A | 4/2010 |
| JP | 2012-3287 A | 1/2012 |
| JP | 2012-27237 A | 2/2012 |
| JP | 2012-58593 A | 3/2012 |

OTHER PUBLICATIONS

International Preliminary Report on Patentability, dated Jan. 22, 2015, issued by the International Searching Authority in counterpart Application No. PCT/JP2013/067371.
Communication dated Nov. 4, 2015 from the Japanese Patent Office issued in corresponding Application No. 2015-015177.
Communication dated May 17, 2016, from the Japanese Patent Office in counterpart application No. 2015-015177.

MASK BLANK AND METHOD OF MANUFACTURING PHASE SHIFT MASK

CROSS REFERENCE TO RELATED APPLICATIONS

This is a Divisional of application Ser. No. 14/414,357, filed Jan. 12, 2015, claiming priority based on International Application No. PCT/JP2013/067371, filed on Jun. 25, 2013, which claims priority from Japanese Patent Application No. 2012-157588, filed on Jul. 13, 2012, the contents of all of which are incorporated herein by reference in their entirety.

TECHNICAL FIELD

The present invention relates to a mask blank, used to fabricate a phase shift mask in the manufacturing of electronic devices such as semiconductor devices (and particularly a phase shift mask of the substrate-engraved type), and a method of manufacturing a phase shift mask.

BACKGROUND ART

Fine patterns are generally formed in the manufacturing process of semiconductor devices using photolithography. Normally multiple layers of substrates referred to as transfer masks are used to form these fine patterns. These transfer masks generally have a fine, thin film pattern composed of a metal thin film and the like provided on a transparent glass substrate. Photolithography is used to fabricate these transfer masks.

Accompanying remarkable improvements in the degree of integration of semiconductor devices in recent years, there is a growing demand for transfer masks that have increasingly fine patterns. Known examples of transfer masks include binary masks and phase shift masks. Binary masks are masks having a light shielding film pattern composed of, for example, a chromium-based material on a transparent substrate. Phase shift masks are masks in which a phase shifter portion is formed that generates a prescribed phase difference on a transparent substrate relative to exposure light. Phase shift masks are able to improve contrast at the interface between the phase shifter portion and light-transmitting portion, namely are able to improve resolution. A known example of this phase shift mask is a half-tone type of phase shift mask having a light semi-transmitting film pattern composed of, for example, a MoSi-based material on a transparent substrate. The light semi-transmitting film pattern allows transmission of light of an intensity that does not substantially contribute to exposure (for example, intensity of 1% to 30% relative to the exposure wavelength) and is also able to generate a prescribed phase difference (for example, 180 degrees) relative to the exposure light. In addition, another example of a phase shift mask is a Levenson-type phase shift mask as disclosed in Patent Literature 1. A Levenson-type phase shift mask is a substrate-engraved type of mask that can be provided with a phase shifter portion by engraving a transparent substrate by etching using a fluorine-based gas.

On the other hand, there is also a mask blank as disclosed in Patent Literature 2. The semi-transparent laminated film of this mask blank is obtained by laminating a phase-advancing film and a phase-retarding film. The phase-advancing film has the property of causing the phase of exposure light that has passed through the film to be advanced more than the phase of exposure light that passes through air by the same distance. Conversely, the phase-retarding film has the property of retarding the phase of exposure light that passes through the film. According to this type of configuration, exposure light that passes through the semi-transparent laminated film can be prevented from generating a phase difference with respect to exposure light that passes through air by the same distance. In the case of a phase shift mask fabricated using this type of mask blank as well, it is necessary to provide grooves engraved to a prescribed depth in the substrate surface. Dry etching using a fluorine-based gas is used to form these grooves.

PRIOR ART LITERATURE

Patent Literature

Patent Literature 1: JP 2007-241065A
Patent Literature 2: JP 2006-215297A

DISCLOSURE OF THE INVENTION

Problems to be Solved by the Invention

In the case of fabricating a Levenson-type phase shift mask of the substrate-engraved type using a mask blank of a structure similar to that of a binary mask blank having a light shielding film formed on a transparent substrate, it is important to control the phase difference between the substrate-engraved portion (phase shift portion) and non-engraved portion (namely, control the difference in substrate thickness between the engraved portion and the non-engraved portion). In order to accurately control phase difference, it is preferable to not allow the exposed portion of the substrate to be engraved by dry etching during the step prior to the step for engraving the aforementioned transparent substrate to a prescribed depth, namely a dry etching step for forming a transfer pattern (light shielding pattern) in the light shielding film of the mask blank.

As is described in Patent Literature 1, in the case a light shielding film is formed with a transition metal-silicon compound, dry etching is typically applied that uses a fluorine-based gas to form a transfer pattern in this light shielding film. However, in the case the light shielding film is formed in contact with the surface of the transparent substrate, it is difficult to avoid engraving the surface of the transparent substrate when carrying out dry etching for forming the transfer pattern in the light shielding film. Consequently, in the mask blank of Patent Literature 1, an etching stopper film made of a chromium-based material is provided between the transparent substrate and the light shielding film. As a result, engraving of the surface of the transparent substrate can be prevented when patterning the light shielding film by dry etching using a fluorine-based gas.

On the other hand, in the case of fabricating a Levenson-type phase shift mask of the substrate-engraved type using a mask blank provided with a conventional light shielding film made of a chromium-based material, fabrication is roughly carried out according to the procedure indicated below. A first resist pattern having a light shielding pattern to be formed on a light shielding film is first formed on the light shielding film. Next, the light-shielding film is dry etched using the first resist pattern as a mask to form the light shielding pattern. The first resist pattern is then removed to form a second resist pattern having a substrate-engraved pattern on the light shielding film. Dry etching for engraving the transparent substrate is then carried out using the second resist pattern as a mask to form a substrate-engraved portion. The second resist pattern is then removed.

In the process for forming the second resist pattern, after having coated and formed a resist film on the light shielding film on which the light-shielding pattern has already been formed, the pattern of the substrate-engraved portion is drawn and exposed on the resist film with an electron beam and the like. However, due to problems with drawing accuracy and the like, it is substantially difficult to align drawing and exposure of the substrate-engraved pattern on the resist film with the edges of the light shielding pattern. Consequently, the pattern of the substrate-engraved portion drawn and exposed on the resist film is typically slightly wider than the width of the substrate-engraved portion which is actually formed on the transparent substrate. Accordingly, a portion where the portion is not covered with the second resist pattern and the surface of the light shielding film is exposed occurs in the vicinity of the pattern edged of the light shielding film. However, since a light shielding film made of a chromium-based material has high durability with respect to dry etching using a fluorine-based gas carried out when engraving a transparent substrate, this did not present a problem in practical terms.

In contrast, in the case of fabricating a Levenson-type phase shift mask of the substrate-engraved type using a mask blank having a light shielding film made of a transition metal-silicon compound as described in Patent Literature 1, if dry etching for engraving the transparent substrate is carried out with the second resist pattern provided in contact with the light shielding film, there is the risk of the vicinity of the pattern edges of the light shielding film not covered by the second resist pattern ending up being etched. In the case an ArF excimer laser is applied for the exposure light in particular, in order to generate phase shift effects, the substrate is required to be engraved to a depth of about 173 nm. Since considerable time is required for etching in order to engrave to this depth, it is difficult to avoid etching of the vicinity of the pattern edges of the light shielding film. Consequently, in the mask blank of Patent Literature 1, an etching mask made of a chromium-based material is provided on the upper surface of the light shielding film.

In this Patent Literature 1, in the case of fabricating a Levenson-type phase shift mask of the substrate-engraved type using a mask blank, fabrication is disclosed as being carried out using the procedure indicated below. A first resist pattern having a light shielding pattern to be formed on a light shielding film is first formed on an etching mask film. Next, dry etching using a mixed gas of a chlorine-based gas and oxygen gas is carried out on the etching mask film using the first resist pattern as a mask to form the light shielding pattern. Continuing, dry etching using a fluorine-based gas is carried out on the light shielding film using the first resist pattern as a mask to form a light shielding pattern. Continuing, dry etching using a chlorine-based gas and oxygen gas is carried out on an etching stopper film using the first resist pattern as a mask to form a light shielding pattern. Continuing, a second resist pattern having a substrate-engraved pattern is formed on the etching mask film by removing the first resist pattern. Continuing, dry etching for engraving a transparent substrate is carried out using the second resist pattern as a mask to form a substrate-engraved portion. The second resist pattern is removed followed by further removing the etching mask film by carrying out dry etching using a mixed gas of a chlorine-based gas and oxygen gas.

In the case of the configuration of the mask blank disclosed in this Patent Literature 1, the first resist pattern is required to remain until the light shielding pattern is formed on the etching stopper film. When forming the light shielding pattern on an etching stopper film made of a chromium-based material, dry etching is carried out using a mixed gas of a chlorine-based gas and oxygen gas. At this time, once the first resist pattern is no longer present, the etching mask film of the chromium-based material having an exposed surface also ends up being etched by the mixed gas. In this case, since an etching mask film is not present between the second resist pattern and light shielding film formed in the subsequent process, the vicinity of the pattern edges of the light shielding film is exposed. When a transparent substrate is engraved by carrying out dry etching using a fluorine-based gas and using the second resist pattern as a mask while in this state, the vicinity of the pattern edges of the light shielding film also ends up being etched, thereby preventing the obtaining of the effect of providing the etching mask film. On the basis thereof, in the fabrication process of a Levenson-type phase shift mask of the substrate-engraved type disclosed in Patent Literature 1, the film thickness of the first resist pattern is 250 nm. As a result, the first resist pattern is allowed to sufficiently remain until completion of the formation of a pattern on the etching stopper film by dry etching.

However, the transfer pattern is required to be miniaturized even in the case of a Levenson-type phase shift mask of the substrate-engraved type. It is necessary to provide a pattern of not more than 50 nm for the transfer pattern on the mask. The thickness of the resist film is required to be less than three times the minimum pattern width in order to form such a transfer pattern (namely, the resist film thickness is required to be less than 150 nm). If the ratio of film thickness to line width in a cross-section of the resist pattern (cross-sectional aspect ratio) is excessively high, pattern collapse or elimination and the like occur, and it becomes difficult to form a high-precision pattern by dry etching on an etching mask film or transparent film. Consequently, even in the case of a Levenson-type phase shift mask of the substrate-engraved type that uses a material enabling dry etching with a fluorine-based gas for the light shielding film, a mask blank is required that enables a pattern of not more than 50 nm to be formed accurately.

Therefore, an object of the present invention is to solve the aforementioned problems of the prior art by providing a mask blank that is suitable for fabricating a phase shift mask of the substrate-engraved type having a light shielding pattern using a material that can be dry-etched by a fluorine-based gas. In addition, an object of the present invention is to provide a method of manufacturing a substrate-engraved type of phase shift mask that uses this type of mask blank.

Means for Solving the Problems

The inventor of the present invention conducted extensive studies to solve the aforementioned problems, thereby leading to completion of the present invention. Namely, the present invention has the configurations indicated below in order to solve the aforementioned problems.

(Configuration 1) A mask blank used to fabricate a phase shift mask having a thin film pattern and a substrate-engraved pattern having a structure in which an etching stopper film, a thin film for pattern formation and an etching mask film are laminated on a transparent substrate in this order, wherein the etching stopper film is made of a material containing chromium and oxygen and the oxygen content is more than 50 at %, the thin film is made of a material that can be dry-etched by a fluorine-based gas, and the etching mask film is made of a material containing chromium, the content of chromium therein being not less than 45 at %, and the content of oxygen therein being not more than 30 at %.

(Configuration 2) The mask blank described in Configuration 1 above, wherein the etching stopper film is made of a material that can be dry-etched using a chlorine-based gas that does not contain oxygen.

(Configuration 3) The mask blank described in Configuration 1 or Configuration 2, wherein the thin film is made of a material containing a transition metal and silicon.

(Configuration 4) The mask blank described in Configuration 3, wherein the thin film has an oxidized layer formed as the surface layer of the thin film, that is placed on a side opposite to the transparent substrate wherein the transition metal content is not more than 4 at % and the oxygen content is not less than 30 at %.

(Configuration 5) The mask blank described in Configuration 3, wherein the thin film has a laminated structure having a lower layer and an upper layer, and the total content of nitrogen and oxygen in the upper layer is greater than the total content of nitrogen and oxygen in the lower layer.

(Configuration 6) The mask blank described in Configuration 5, wherein the upper layer has an oxidized layer formed as the surface layer of the thin film, that is placed on a side opposite to the lower layer wherein the transition metal content is not more than 4 at % and the oxygen content is not less than 30 at %.

(Configuration 7) The mask blank described in Configuration 1 or Configuration 2, wherein the thin film is made of a material containing tantalum.

(Configuration 8) The mask blank described in Configuration 7, wherein the thin film has a highly oxidized layer having an oxygen content of not less than 60 at % formed as the surface layer of the thin film, that is placed on a side opposite to the transparent substrate.

(Configuration 9) The mask blank described in any of Configurations 1 to 8, wherein a resist film having a thickness of less than 150 nm is provided on the etching mask film.

(Configuration 10) The mask blank described in any of Configurations 1 to 9, wherein the thickness of the etching stopper film is not less than 3 nm and not more than 10 nm.

(Configuration 11) The mask blank described in any of Configurations 1 to 10, wherein the thickness of the etching mask film is not less than 3 nm and not more than 15 nm.

(Configuration 12) The mask blank described in any of Configurations 1 to 11, wherein the thickness of the thin film is not more than 60 nm.

(Configuration 13) The mask blank described in any of Configurations 1 to 12, which has a laminated structure having the thin film and the etching stopper film, and wherein the optical density relative to ArF exposure light is not less than 2.8.

(Configuration 14) A method of manufacturing a phase shift mask using the mask blank described in any of Configurations 1 to 13, comprising a step for forming a first resist pattern on the etching mask film, a step for forming an etching mask pattern by dry etching the etching mask film using a mixed gas of a chlorine-based gas and oxygen gas and using the first resist pattern as a mask, a step for removing the first resist pattern, a step for forming a thin film pattern by dry etching the thin film using a fluorine-based gas and using the etching mask pattern as a mask, a step for forming an etching stopper pattern by dry etching the etching stopper film using a chlorine-based gas that does not contain oxygen gas and using the etching mask pattern as a mask, a step for forming a second resist pattern on the etching mask pattern, a step for forming a substrate-engraved pattern by dry etching a transparent substrate using a fluorine-based gas and using the second resist pattern as a mask, a step for removing the second resist pattern, and a step for removing the etching mask pattern.

(Configuration 15) The method of manufacturing a phase shift mask described in Configuration 14, wherein the step for removing the etching mask pattern is carried out by dry etching using a mixed gas of a chlorine-based gas and oxygen gas.

Effects of the Invention

According to the present invention, in a mask blank having a structure in which an etching stopper film, a thin film for pattern formation and an etching mask film are laminated on a transparent substrate in this order, and wherein the thin film is made of material that can be dry-etched by a fluorine-based gas, even in the case of fabricating a phase shift mask of the substrate-engraved type using this mask blank, a mask blank can be provided in which the pattern accuracy of the thin film can be enhanced and the accuracy of the phase difference between a substrate-engraved portion and a non-engraved portion can be increased.

BEST MODE FOR CARRYING OUT THE INVENTION

Figure 1:
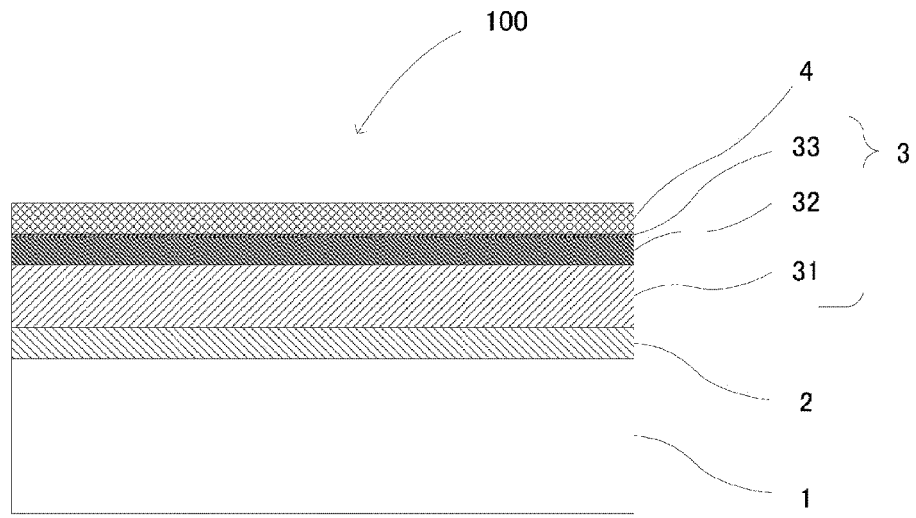
FIG. 1 is a cross-sectional view showing the layer configuration of a mask blank according to an embodiment of the present invention.

The following provides a detailed explanation of embodiments of the present invention.

The present invention relates to a mask blank used to fabricate a phase shift mask having a thin film pattern and a substrate-engraved pattern. More specifically, the present invention relates to a mask blank having a structure in which an etching stopper film, a thin film for pattern formation and an etching mask film are laminated on a transparent substrate in this order, wherein the etching stopper film is made of a material containing chromium and oxygen and the oxygen content is more than 50 at %, the thin film is made of a material that can be dry-etched by a fluorine-based gas, and the etching mask film is made of a material containing chromium, the content of chromium therein is not less than 45 at %, and the content of oxygen therein is not more than 30 at %.

The inventor of the present invention conducted extensive studies on a configuration for satisfying all of three of the conditions of: (1) forming a thin film for pattern formation with a material that enables patterning by etching with a fluorine-based gas, (2) being able to form a fine pattern having a line width of, for example, not more than 50 nm in the thin film, and (3) being able to form an engraved pattern having a prescribed engraving depth, in a transparent substrate in a mask blank having a structure in which an etching stopper film, the thin film and an etching mask film are laminated on a transparent substrate in this order.

The etching stopper film is required to have the property of being resistant to etching when the thin film directly above is patterned by dry etching with a fluorine-based gas. In addition, the etching stopper film is required to be patterned in the next process. At that time, engraving of the surface of the transparent substrate directly beneath the etching stopper film must be avoided. Accordingly, the etching stopper film must be able to be patterned by an etching gas other than a fluorine-based gas. Materials having such properties are limited, and materials containing chromium are able to satisfy two of the aforementioned requirements.

On the other hand, the film thickness of the resist film must at least be less than 150 nm in order to form a fine pattern having a line width of not more than 50 nm. Since the thin film is required to have a prescribed minimum light shielding performance, it is required to have a certain minimum film thickness. On the basis thereof, it is necessary to interpose an etching mask film between the thin film and the resist film. This etching mask film is required to have the property of being resistant to etching when the thin film directly beneath the etching mask film is patterned by dry etching with a fluorine-based gas. Materials having such properties are limited, and a material containing chromium is able to satisfy this requirement.

However, the following problems occur in the case the materials that form the etching mask film and the etching stopper film are both materials that contain chromium. The resist film (resist pattern) having a fine pattern to be formed on the thin film has restrictions on film thickness. Consequently, even if patterning of the thin film for pattern formation and patterning of the etching stopper film are carried out with the resist pattern still remaining after having patterned the etching mask film, there is the risk of the resist pattern being lost during patterning of the etching stopper film. In the case of patterning the etching stopper film by dry etching with a mixed gas of a chlorine-based gas and oxygen gas as in the prior art, since the resist pattern is lost, the etching mask film also ends up being etched since the surface thereof is in an unprotected state.

On the other hand, in the case the thickness of the resist pattern is excessively thin in this manner, if dry etching is carried out on the thin film with a fluorine-based gas with the resist pattern still remaining after patterning the etching mask pattern, there is the risk of the resist pattern being lost during etching of the thin film. During dry etching, if a resist pattern of an organic material is present, carbon and oxygen are generated when that resist pattern is etched, and have an effect on the etching environment during dry etching of the thin film. If a resist pattern containing carbon and oxygen is lost during the course of dry etching the thin film, the environment ends up changing during the course of etching and this results in the risk of having a detrimental effect on pattern accuracy (such as the accuracy of the shape of pattern sidewalls or in-plane CD accuracy), thereby making this undesirable.

In addition, since the etching gas during dry etching of the etching mask film and the etching gas during dry etching of the thin film differ, these etching processes are frequently carried out in separate etching chambers. The generation of carbon and oxygen attributable to the resist pattern can be a factor behind the occurrence of defects during dry etching. Consequently, after having patterned the etching mask film, a mask blank is preferably introduced into the etching chamber where the thin film is dry etched after stripping the resist pattern. In these cases as well, since a resist pattern is not present when patterning the etching stopper film by dry etching with a mixed gas of a chlorine-based gas and oxygen, the etching mask film also ends up being etched.

A resist pattern having a substrate-engraved pattern is unable to protect the pattern edge portions of a thin film pattern for the reasons described above. When dry etching is carried out with a fluorine-based gas that engraves a transparent substrate by using a resist pattern having a substrate-engraved pattern as a mask in a state in which the film thickness of the etching mask film ends up being considerably thin or the etching mask film ends up being lost by dry etching, there is the risk of the pattern edge portions of the thin film pattern also being etched.

Figure 2:
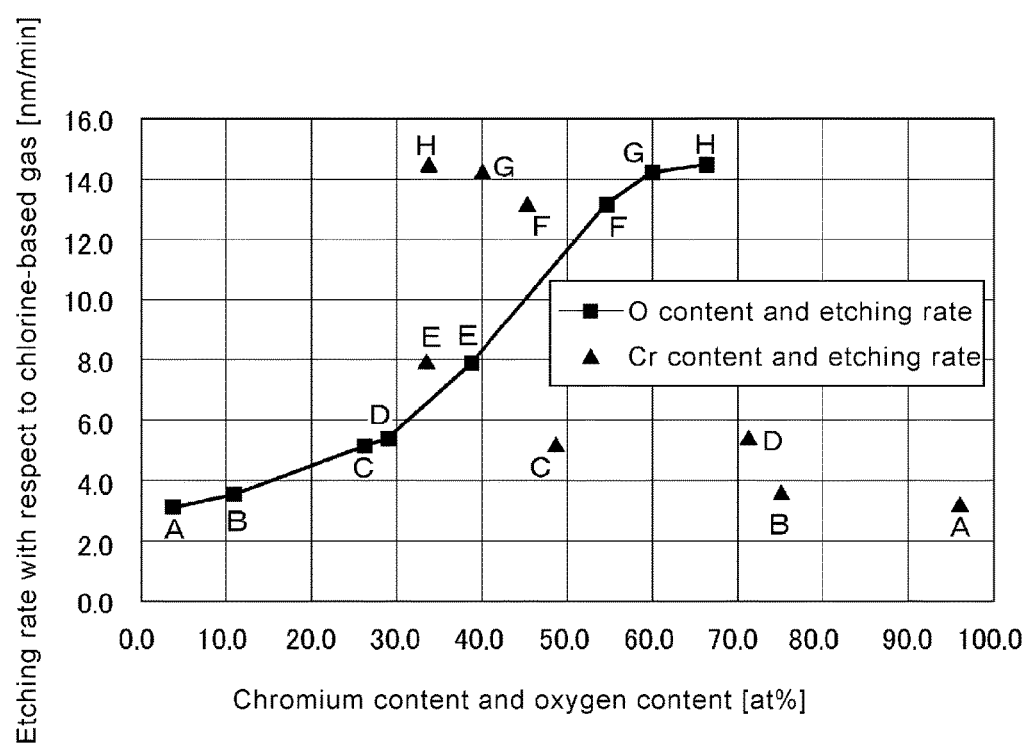
FIG. 2 is a graph indicating the relationship between the chromium content and oxygen content of a thin film and etching rate with respect to a chlorine-based gas.
Figure 3:
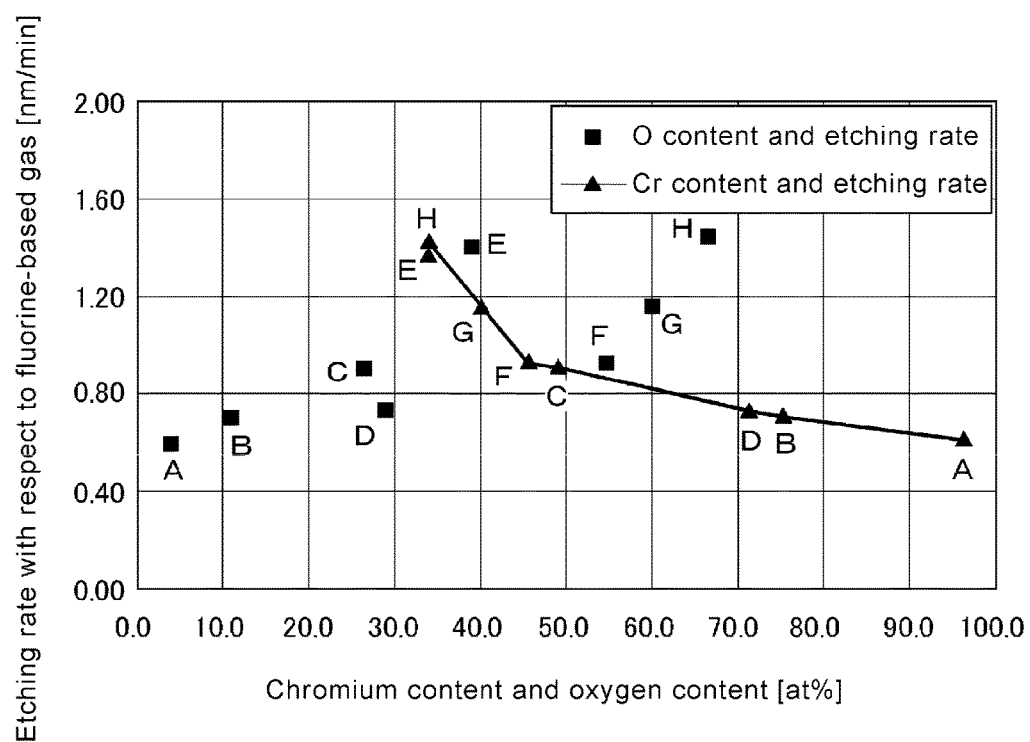
FIG. 3 is a graph indicating the relationship between the chromium content and oxygen content of a thin film and etching rate with respect to a fluorine-based gas.

In order to solve these problems, the present inventor thought of dry etching the etching stopper film with a chlorine-based gas not containing oxygen. The possibility was then examined of enabling the etching stopper film to be dry etched with a chlorine-based gas not containing oxygen and imparting the etching mask film with the property of being resistant to both dry etching with a chlorine-based gas not containing oxygen and dry etching with a fluorine-based gas even in the case of having formed both the etching stopper film and the etching mask film with a chromium-based material. First, an experiment was conducted that consisted of respectively carrying out dry etching using a chlorine-based gas ($Cl_2$) for the etching gas and dry etching using a fluorine-based gas ($CF_4$) for the etching gas on eight types of sample films made of chromium-base materials as shown in Table 1 followed by confirming the etching rates of each sample film. FIG. 2 shows the etching rates of each sample with respect to the chlorine-based gas ($Cl_2$). FIG. 3 shows the etching rates of each sample film with respect to the fluorine-based gas ($CF_4$).

TABLE 1

| | | Content in film [at %] | | | |
|---|---|---|---|---|---|
| Sample | Film material | Cr | O | N | C |
| A | CrO-based | 96.1 | 3.9 | — | — |
| B | Cr(O)N-based | 75.0 | 11.0 | 14.0 | — |
| C | CrOCN-based | 48.9 | 26.4 | 14.1 | 10.6 |
| D | CrO-based | 70.9 | 29.1 | — | — |
| E | CrOCN-based | 33.6 | 38.9 | 16.3 | 11.2 |
| F | CrO-based | 45.5 | 54.5 | — | — |
| G | CrO-based | 40.0 | 60.0 | — | — |
| H | CrO-based | 33.7 | 66.3 | — | — |

In FIG. 2, the relationship between the oxygen content of each sample film and the etching rate with respect to chlorine-based gas is plotted with black squares (■). In addition, the relationship between the chromium content of each sample film and etching rate with respect to chlorine-based gas is plotted with black triangles (▲). Furthermore, the letters corresponding to each plot indicated with black squares (■) and black triangles (▲) in FIG. 2 correspond to the letter of each sample film. In looking at these results, a correlation can be understood to be seen between the oxygen content in the film and the etching rate with respect to chlorine-based gas. In addition, the effect of containing nitrogen or carbon in the sample films can be understood to be low. On the other hand, the correlation between chromium content and etching rate with respect to chlorine-based gas can be understood to also be low.

According to the results of FIG. 2, if the oxygen content in a chromium-based material film is greater than 50 at %, the etching rate with respect to chlorine-based gas can be understood to increase considerably to not less than 12.0 nm/min. In addition, if the oxygen content in a chromium-based material film is not less than 60 at %, etching rate with respect to chlorine-based gas can be understood to increase further to 14.0 nm/min. As a result of studying the experimental results of FIG. 2, the conclusion was reached that the content of oxygen in a chromium-based material that forms the etching stopper film is required to be greater than 50 at %.

On the other hand, in the case the oxygen content of a chromium-based material film is not more than 30 at %, the etching rate with respect to chlorine-based gas is less than 6.0 nm/min, which can be understood to be less than one-half the etching rate with respect to chlorine-based gas of a chromium-based material film having an oxygen content of more than 50 at %. In addition, in the case the oxygen content in a chromium-based material film is not more than 15 at %, the etching rate with respect to chlorine-based gas is not more than 4.0 nm/min, which can be understood to be not more than one-third of the etching rate with respect to chlorine-based gas of a chromium-based material film having an oxygen content of more than 50 at %.

On the other hand, in FIG. 3, the relationship between the oxygen content of each sample film and etching rate with respect to fluorine-based gas is plotted with black squares (■). In addition, the relationship between the chromium content of each sample film and etching rate with respect to fluorine-based gas is plotted with black triangles (▲). Furthermore, the letters corresponding to each plot indicated with black squares (■) and black triangles (▲) in FIG. 3 correspond to the letter of each sample film. In looking at the results, a correlation can be understood to be seen between chromium content and etching rate with respect to fluorine-based gas. In addition, the effect of containing nitrogen or carbon in the sample film can be understood to be low. On the other hand, the correlation between oxygen content and etching rate with respect to fluorine-based gas can be understood to be low.

In addition, according to the results of FIG. 3, in the case the chromium content in a chromium-based material film is less than 45 at %, the degree of the rise in etching rate with respect to fluorine-based gas can be understood to increase. In the case of low resistance to dry etching with fluorine-based gas, when engraving a transparent substrate by carrying out dry etching with a fluorine-based gas using a resist film having a substrate-engraved pattern as a mask, there is the risk of the portion where the surface of the etching mask film is exposed ending up being lost by etching, the pattern edge portions of the thin film end up being exposed, and the pattern edge portions end up being etched. As a result of examining the experimental results of FIG. 2 and FIG. 3, the conclusion was reached that the chromium content of a chromium-based material that forms the etching mask film is required to be not less than 45 at % and the oxygen content is required to be not more than 30 at %.

As a result of selecting an etching stopper film and etching mask film having characteristics as described above, a sufficiently high etching rate with respect to chlorine-based gas not containing oxygen can be secured for the etching stopper film and etching time when forming a pattern can be shortened. Moreover, since the etching rate of the etching mask film with respect to chlorine-based gas not containing oxygen is less than one-half that of the etching stopper film, adequate film thickness can be secured even after having formed a pattern on the etching stopper film. Since the etching mask film is also provided with the property of sufficiently high resistance to etching rate with respect to fluorine gas, the pattern edges of the thin film can be protected until completion of dry etching with fluorine-based gas used to engrave a transparent substrate. Namely, in the present invention, since a chromium-based material able to be used for the etching stopper film and a chromium-based material able to be used for the etching mask film mutually have considerably different properties, it is difficult to obtain the effects of the present invention if the chromium-based materials of the etching stopper film and the etching mask film are interchanged.

FIG. 1 is a cross-sectional view showing the structure of a mask blank according to the present invention. A mask blank 100 of the present invention shown in FIG. 1 has a structure in which an etching stopper film 2, a thin film for pattern formation 3 and an etching mask film 4 are laminated in order on a transparent substrate 1.

There are no particular limitations on the transparent substrate 1 provided it has transparency with respect to the exposure wavelength used. In the present invention, a synthetic quartz glass substrate or various types of glass substrates thereof (such as soda lime glass or aluminosilicate glass) can be used for the transparent substrate 1. In the miniaturization of a pattern of a semiconductor device, in addition to miniaturization of the mask pattern formed on a phase shift mask, it is also necessary to use a shorter wavelength for the exposure light source wavelength used in photolithography during fabrication of the semiconductor device. The use of shorter wavelengths in the manner of a transition from KrF excimer lasers (wavelength: 248 nm) to ArF excimer lasers (wavelength: 193 nm) has progressed in recent years for use as exposure light sources during fabrication of semiconductor devices. Among the various types of glass substrates, since synthetic quartz glass substrates demonstrate particularly high transparency in the wavelength band of ArF excimer lasers or shorter wavelength bands, they are preferable for use as a transparent substrate in the mask blank of the present invention used to form a high-definition transfer pattern.

The material applied to the etching stopper film 2 is a material that contains chromium and oxygen and has an oxygen content of greater than 50 at %. The material applied to the etching stopper film 2 is only required to be a chromium-based material that satisfies this condition, and other elements may be contained provided they do not significantly alter etching properties. Examples of preferable materials used in the etching stopper film include chromium oxides and chromium compounds in which one or more types of elements selected from nitrogen, carbon, hydrogen and boron have been added to chromium and oxygen. Furthermore, based on the results shown in FIG. 3, if the chromium content of the material applied to the etching stopper film 2 is not less than 40 at %, resistance to dry etching with fluorine-based gas is further improved, thereby making this preferable, while a chromium content of not less than 45 at % is more preferable. From the viewpoint of adequately demonstrating the aforementioned functions, the thickness of the etching stopper film 2 is preferably not less than 3 nm and not more than 10 nm. If the film thickness is less than 3 nm, it becomes difficult to adequately demonstrate the function that prevents the surface of the transparent substrate 1 from being etched when patterning the thin film 3 during dry etching with fluorine-based gas. The thickness of the etching stopper film 2 is more preferably not less than 4 nm. On the other hand, in the case the thickness of the etching stopper film 2 is greater than 10 nm, etching time is prolonged when patterning the etching stopper film 2 by dry etching with a chlorine-based gas not containing oxygen, which is not preferable since it causes an increase in the etched amount of the surface of the etching mask film 4. The thickness of the etching stopper film 2 is more preferably not more than 7 nm.

Although the etching rate of the etching stopper film 2 with respect to chlorine-based gas not containing oxygen is greatly affected by the oxygen content in the film, it is also somewhat affected by the chromium content. Dry etching of chromium-based materials is carried out by causing the formation of a chloride oxide having a low boiling point (chromyl hydrochloride) in a low-pressure chamber and volatilizing the chloride oxide from the transparent substrate 1. Accordingly, if the chromium content in the etching stopper film 2 is low, the amount of oxygen required to form the chromyl hydrochloride also decreases. However, since it is also necessary to consider bonding of other elements contained in the etching stopper film 2 with oxygen, it is difficult to say that the effect of chromium content in the film on etching rate is large. On the basis thereof, in the case the chromium content of the material that forms the etching stopper film 2 is not more than 40 at %, it is possible to obtain an etching rate that at least allows the effects of the present invention to be demonstrated if the oxygen content in the material is within the range of not less than 45 at %.

The thin film 3 uses a material that is able to form a fine pattern by dry etching with a fluorine-based gas. Examples of materials having this property include materials containing silicon, materials containing a transition metal and silicon, and materials containing tantalum. Preferable examples of materials containing silicon include simple silicon and compounds containing silicon and one or more elements selected from oxygen, nitrogen, carbon and boron. Preferable examples of materials containing a transition metal and silicon include materials composed of a transition metal and silicon, and compounds containing a transition metal, silicon and one or more types of elements selected from oxygen, nitrogen, carbon and boron. In addition, preferable examples of transition metals in this case include one or more types of metals selected from molybdenum, tantalum, tungsten, titanium, chromium, hafnium, nickel, vanadium, zirconium, ruthenium, rhodium, niobium, palladium, iron, copper, zinc, silver, platinum and gold.

Preferable examples of materials containing tantalum include simple tantalum metal and compounds containing tantalum and one or more types of elements selected from oxygen, nitrogen, carbon and boron. In addition, other examples include alloys containing tantalum and one or more types of metals selected from hafnium, zirconium and molybdenum, and compounds in which one or more types of elements selected from oxygen, nitrogen, boron and carbon have been added to this alloy.

The optical properties required of the thin film 3 vary according to the type of phase shift mask fabricated using this mask blank 100. In the case of a mask blank for fabricating a Levenson-type phase shift mask of the substrate-engraved type, the laminated structure of the etching stopper film 2 and the thin film 3 is required to have an optical density (OD) of not less than a prescribed value. In this case, the thin film 3 functions as a portion of a light-shielding film. The laminated structure of the etching stopper film 2 and the thin film 3 is required to have an optical density with respect to the wavelength of the exposure light of at least not less than 2.5, preferably not less than 2.8 and more preferably not less than 3.0. Since the oxygen content of the etching stopper layer 2 is more than 50 at % and it is necessary to reduce the thickness thereof, light shielding performance is not that high. Consequently, it is preferable to secure the aforementioned optical density of not less than a prescribed value required by the laminated structure with the etching stopper film 2 with the thin film 3 alone, and more preferable to secure all of the aforementioned optical density in this manner.

The thin film 3 can adopt the form of a single-layer structure or laminated structure of not less than two layers. In a phase shift mask fabricated from this mask blank 100, the pattern formed on the transparent substrate is formed by a laminated structure of the etching stopper film 2 and the thin film 3. In the case of prioritizing reduction of total film thickness over reducing surface reflection of the pattern, the thin film 3 is preferably a single-layer structure. In general, materials having high optical density tend to have a higher reflectance with respect to exposure light. The surface reflectance of the thin film pattern is preferably suppressed to a certain degree or lower (for example, surface reflectance with respect to ArF exposure light is not more than 40% and preferably not more than 30%). In the case of taking this into consideration, the thin film 3 preferably has a structure in which an upper layer 32 having the function of reducing surface reflectance is laminated on a lower layer 31 having high light shielding performance. In addition, the film thickness of the thin film 3 is preferably not more than 60 nm and more preferably not more than 55 nm.

In the case of forming the thin film 3 in the form of a single layer structure using the aforementioned material containing a transition metal and silicon, it is preferable to reduce the contents of elements other than the transition metal and silicon in the film, and particularly the contents of oxygen and nitrogen that easily cause a decrease in optical density, as much as possible in order to secure optical density. On the other hand, such materials tend to have low chemical resistance and low light fastness with respect to ArF exposure light. In addition, such materials cannot be said to have sufficiently high resistance to dry etching with a mixed gas of a chlorine-based gas and oxygen gas used when removing the etching mask film 4 laminated on the surface of the thin film 3. The aforementioned chemical resistance, ArF light fastness and etching resistance tend to decrease as the content of transition metal in the film increases. In addition, this resistance tends to increase as the content of oxygen in the film increases. In consideration thereof, in the case of forming the thin film 3 in the form of a single layer structure using the aforementioned material containing a transition metal and silicon, an oxidized layer is preferably provided as the surface layer thereof in which the content of transition metal in the oxidized layer is not more than 4 at % and the content of oxygen is not less than 30 at %.

In the case of forming the thin film 3 in the form of a laminated structure having the lower layer 31 and the upper layer 32 using the aforementioned material containing a transition metal and silicon, the content of elements other than transition metal and silicon in the lower layer 31, and particularly the content of oxygen and nitrogen that easily lower optical density, is preferably as low as possible in order to secure optical density. In addition, it is necessary to have the upper layer 32 contain oxygen and nitrogen, increase the refractive index in the upper layer 32 and reduce the extinction coefficient thereof in order to reduce surface reflection. However, in order to secure as high an optical density as possible in the upper layer 32, it is preferable to reduce the content of oxygen that significantly lowers the extinction coefficient k. Consequently, even in the case of the thin film 3 having a laminated structure having the lower layer 31 and the upper layer 32, the chemical resistance, ArF light fastness and etching resistance of the upper layer 32 cannot be said to be sufficiently high. Accordingly, even in the case of the thin film 3 employing a laminated structure having the lower layer 31 and the upper layer 32 and forming each layer with a material containing a transition metal and silicon, an oxidized layer 33 is preferably provided as the surface layer of the upper layer 32 in which the content of transition metal is not more than 4 at % and the oxygen content is not less than 30 at %.

In the case of forming the thin film 3 or lower layer 31 having a single layer structure using the aforementioned material containing a transition metal and silicon, the percentage [%] determined by dividing the content [at %] of transition metal (M) in the material by the total content of transition metal (M) and silicon (Si) (to be referred to as the ratio of M/M+Si) is preferably not less than 9% and not more than 35% and more preferably not less than 11% and not more than 33%. If a material containing a transition metal and silicon has a ratio of M/M+Si within these ranges, the optical density of the material can be further increased. In the case of forming the thin film 3 and lower layer 31 having a single layer structure using the aforementioned material containing a transition metal and silicon, the nitrogen content in the material is preferably not less than 21 at %. In the case of applying a corrective technique for correcting black defects discovered following patterning of the thin film 3 by irradiating with an electron beam while supplying xenon difluoride gas (EB defect correction), if the nitrogen content of the film is not less than 21 at %, etching by xenon difluoride gas can be inhibited at those locations not irradiated with the electron beam.

In the case of forming the thin film 3 in the form of a single layer structure using the aforementioned material containing tantalum, it is preferable to reduce the contents of elements other than tantalum in the film, and particularly the contents of oxygen and nitrogen that easily cause a decrease in optical density, as much as possible in order to secure optical density. On the other hand, such materials tend to have low chemical resistance and low light fastness with respect to ArF exposure light. In addition, such materials cannot be said to have sufficiently high resistance to dry etching with a mixed gas of a chlorine-based gas and oxygen gas used when removing the etching mask film 4 laminated on the surface of the thin film 3. Consequently, in the case of forming the thin film 3 in the form of a single layer structure using the aforementioned material containing tantalum, a highly oxidized layer is preferably formed as the surface layer thereof in which the content of oxygen is not less than 60 at %.

The crystal structure of the thin film 3 of the mask blank 100 is preferably microcrystalline and more preferably amorphous. In this case, it becomes difficult for the crystal structure within the thin film to take on a single layer structure, while facilitating the transition to a state in which a plurality of crystal structures is present. Accordingly, in the case of a highly oxidized layer in which the oxygen content is not less than 60 at %, the highly oxidized layer easily enters a state in which a mixture of TaO bonds, $Ta_2O_3$ bonds, $TaO_2$ bonds and $Ta_2O_5$ bonds are present. As the proportion of $Ta_2O_5$ bonds present in the highly oxidized layer increases, chemical resistance, ArF light fastness and resistance to dry etching with a mixed gas of oxygen and chlorine improve.

If the oxygen content in the highly oxidized layer is 60 at % to less than 66.7 at %, the bound state of tantalum and oxygen in the layer is thought to be such that the bound state tends to mainly consist of $Ta_2O_3$ bonds, while the least stable bound state in the form of TaO bonds is thought to be extremely lower than the case of the oxygen content in the layer being less than 60 at %.

In addition, if the oxygen content of the highly oxidized layer is not less than 66.7 at %, the bound state of tantalum and oxygen in the layer is thought to be such that the bound state tends to mainly consist of $TaO_2$ bonds, while the least stable bound state in the form of TaO bonds and the next least stable bound state in the form of $Ta_2O_3$ bonds are both thought to be extremely low.

If the oxygen content of the highly oxidized layer is not less than 68 at %, the bound state of tantalum and oxygen in the layer is thought to be such that, not only does the bound state mainly consist of $TaO_2$ bonds, but that there is also a high proportion of $Ta_2O_5$ bonds. In the case of such oxygen content, $Ta_2O_3$ bonds are only rarely present and TaO bonds are no longer able to exist. Moreover, if the oxygen content in the highly oxidized layer is 71.4 at %, the bound state of tantalum and oxygen in the layer is thought to substantially consist of $Ta_2O_5$ bonds only. This state is the most preferable since chemical resistance, ArF light fastness and resistance to dry etching with a mixed gas of oxygen and chlorine are extremely high.

Examples of methods used to form the highly oxidized layer as the surface layer of the thin film 3 made of a material containing tantalum include subjecting a substrate in which the thin film 3 is formed on the transparent substrate 1 to hot water treatment, ozone-containing water treatment, ozone water treatment, heat treatment in a gas containing oxygen, ultraviolet irradiation treatment in a gas containing oxygen, $O_2$ plasma treatment and natural oxidation. Among these methods, the aforementioned methods employing various types of surface treatment other than natural oxidation are particularly preferable from the viewpoints of productivity and allowing the formation of a highly oxidized layer of uniform film thickness.

In order to adequately obtain function and effects as described above, the thickness of the highly oxidized layer is preferably not less than 1.5 nm and not more than 4 nm. If the thickness is less than 1.5 nm, effects are unable to be adequately obtained, while if the thickness is more than 4 nm, effects on the optical properties of the thin film 3 end up becoming excessively large. In consideration of the proper balance among each of the viewpoints of securing optical density for the total thin film for pattern formation 3 and improving chemical resistance, ArF light fastness and resistance to dry etching with a mixed gas of oxygen and chlorine, the thickness of the highly oxidized layer is more preferably not less than 1.5 nm and not more than 3 nm.

In the case of forming the thin film 3 in the form of a laminated structure having the lower layer 31 and the upper layer 32 using the aforementioned material containing tantalum, the content of elements other than tantalum in the lower layer 31, and particularly the content of oxygen and nitrogen that easily lower optical density, is preferably as low as possible in order to secure optical density. In addition, it is necessary to have the upper layer 32 contain oxygen and nitrogen, increase the refractive index in the upper layer 32 and reduce the extinction coefficient thereof in order to reduce surface reflection. However, in order to secure as high an optical density as possible in the upper layer 32, the content of oxygen, which significantly lowers the extinction coefficient k, is preferably less than 60 at %. Consequently, even in the case of the thin film 3 having a laminated structure having the lower layer 31 and the upper layer 32, the chemical resistance, ArF light fastness and etching resistance of the upper layer 32 cannot be said to be sufficiently high. Accordingly, even in the case of the thin film 3 employing a laminated structure having the lower layer 31 and the upper layer 32 and forming each layer with a material containing tantalum, the highly oxidized layer 33 is preferably formed as the surface layer of the upper layer 32 in which the oxygen content is not less than 60 at %. Other matters relating to the highly oxidized layer 33 formed as the surface layer are the same as in the highly oxidized layer formed as the thin film of a single layer structure using the aforementioned material containing tantalum.

The thin film 3 in the case of a single layer structure and the lower layer 31 of the thin film 3 in the case of a laminated structure are preferably formed with a material that contains tantalum and nitrogen. In these cases, if the nitrogen content is less than 62 at % (preferably not more than 51 at % and more preferably not more than 30 at %), surface roughness in terms of Rq can be held to not more than 0.60 nm.

The material applied to the etching mask film 4 is a material that contains chromium, has a chromium content of not less than 45 at %, and has an oxygen content of not more than 30 at %. The material applied to the etching mask film 4 is only required to be a chromium-based material that satisfies this condition, and other elements may be contained provided they do not significantly alter etching properties. Examples of preferable materials used in the etching mask film 4 include chromium metal and chromium compounds in which one or more types of elements selected from oxygen, nitrogen, carbon, hydrogen and boron have been added to chromium. The chromium content in the etching mask film 4 is preferably not less than 50 at % and more preferably not less than 60 at %. Furthermore, the etching mask film 4 may also be formed by depositing on the thin film 3 under deposition conditions that aggressively prohibit the containing of oxygen, followed by carrying out heat treatment and the like in a gas that contains oxygen (such as in air). As a result, the etching mask film 4 can be formed in which the chromium content in the film is not less than 45 at % and the oxygen content is not more than 30 at %.

In the case of using a resist pattern having a film thickness of less than 150 nm in which a fine pattern having a line width of not more than 50 nm has been formed as a mask, and forming a pattern in the etching mask film 4 by dry etching using a mixed gas of a chlorine-based gas and oxygen gas, it is necessary that the pattern be able to be formed with high accuracy and fineness. As the content of chromium in the etching mask film 4 increases, the etching rate with respect to etching using a mixed gas of a chlorine-based gas and oxygen gas tends to decrease. In consideration of this point, the chromium content in the etching mask film 4 is preferably at least less than 90 at %, more preferably not more than 85% at % and even more preferably not more than 80 at %.

In the aforementioned case, the etching mask film 4 preferably contains nitrogen, carbon and the like. This is because these elements are easily volatilized during dry etching. However, if the contents of nitrogen and carbon in the etching mask film 4 are excessively high, there is the risk of a decrease in resistance to dry etching with a fluorine-based gas. In consideration thereof, the lower limit of the nitrogen content in the etching mask film 4 is preferably 10 at % and more preferably 15 at %. In addition, the upper limit of the nitrogen content in the etching mask film 4 is preferably 30 at % and more preferably 20 at %. Similarly, the lower limit of the carbon content in the etching mask film 4 is preferably 5 at % and more preferably 10 at %. In addition, the upper limit of the carbon content in the etching mask film 4 is preferably 20 at % and more preferably 15 at %.

From the viewpoint of adequately demonstrating the aforementioned functions, the thickness of the etching mask film 4 is preferably not less than 3 nm and not more than 15 nm. When carrying out dry etching with a fluorine-based gas on the thin film 3 or transparent substrate 1, gradual etching of the etching mask film 4 cannot be avoided. If the film thickness of the etching mask film 4 is less than 3 nm, there is the risk of being unable to maintain the shape of the fine pattern formed in the etching mask film 4 during the course of etching when forming a fine pattern by dry etching the thin film 3 with a fluorine-based gas. In addition, when forming an engraved pattern by dry etching the transparent substrate 1 with a fluorine-based gas, there is the risk of the etching mask film 4 being lost thereby causing the pattern edges of the thin film 3 to no longer be able to be protected during the course of etching. The thickness of the etching mask film 4 is more preferably not less than 4 nm.

If the thickness of the etching mask film 4 is greater than 15 nm, there is the risk of being unable to maintain the shape of the resist pattern, as well as the risk of the resist pattern being lost, during the course of forming a fine pattern in the etching mask film 4 by using a resist pattern having a film thickness of less than 150 nm as a mask and dry etching using a mixed gas of a chlorine-based gas and oxygen gas, thereby making this undesirable. The thickness of the etching mask film 4 is more preferably not more than 10 nm.

In the case the phase shift mask fabricated using the mask blank 100 is an enhancer-type phase shift mask, the optical properties required of the thin film 3 differ considerably from the case of a Levenson-type phase shift mask. In an enhancer-type phase shift mask, it is necessary to only generate a prescribed phase difference that allows the obtaining of phase shift effects between exposure light that passes through the engraved portion of the substrate and exposure light that passes through the non-engraved transparent portion of the substrate in the same manner as in the case of a Levenson-type phase shift mask. However, in an enhancer-type phase shift mask, the thin film 3 is required to be a semi-light-transmitting film through which exposure light passes at a prescribed transmittance, while also being required to have the property of a small phase difference between exposure light that passes through the thin film 3 (semi-light-transmitting film) and exposure light that passes through the non-engraved transparent portion of the substrate.

In the case the mask blank 100 is used to fabricate an enhancer-type phase shift mask, the thin film 3 is required to simultaneously demonstrate both the optical properties of transmittance with respect to exposure light being within the range of 1% to 20%, and phase difference generated between exposure light that passes through the thin film 3 and exposure light that passes through air over a distance equal to the film thickness of the thin film 3 being within the range of −30 degrees to +30 degrees. Examples of materials that allow these properties to be easily obtained include the aforementioned materials containing silicon and the materials containing a transition metal and silicon. Materials containing a transition metal and silicon are particularly preferable. The thin film 3 preferably has a laminated structure having the lower layer 31 and the upper layer 32 in order to form the thin film 3 with a material containing a transition metal and silicon and satisfy the optical properties required of the aforementioned semi-light-transmitting film.

The material is preferably composed of a transition metal and silicon in order to reduce the aforementioned phase difference. However, it is difficult to make transmittance with respect to exposure light to be within the aforementioned range in the case of a single layer film made of this material. In order to solve this problem, the lower layer 31 is formed with a material composed of a transition metal and silicon, or with a material containing a transition metal and silicon in which the content of oxygen and nitrogen is not more than 10 at % to facilitate movement of the phase difference in the direction in which it becomes larger. Moreover, the upper layer 32 is formed with material that contains a transition metal and silicon that also contains oxygen and nitrogen at greater than 10 at %, in which the transmittance of the material with respect to exposure light tends to be high while the aforementioned phase difference tends to become large. As a result, transmittance and phase difference of the thin film 3 can be adjusted to be within the aforementioned ranges by adjusting the optical properties (refractive index n, extinction coefficient k) and film thickness of the lower layer 31 and the upper layer 32.

Preferable examples of methods used to form the etching stopper film 2, the thin film 3 and the etching mask film 4 on the aforementioned transparent substrate 1 include sputtering deposition methods such as DC sputtering, RF sputtering or ion beam sputtering. In the present invention, however, the film deposition method is not limited to sputtering deposition.

The previously explained mask blank of the present invention is a transfer mask that may be provided with a fine pattern in the manner of a line width of not more than 50 nm and which is used in an exposure apparatus that uses exposure light of a short wavelength of not more than 200 nm (such as an ArF excimer laser) for the exposure light source, and is particularly suitable for fabricating a phase shift mask of the substrate-engraved type. Examples of phase shift mask of substrate-engraved type include Levenson-type phase shift masks of the substrate-engraved type and enhancer-type phase shift masks. The mask blank of the present invention is suitable for the fabrication of transfer masks having a substrate-engraved portion, a transparent portion where the substrate is not engraved, and a thin film pattern formed with the thin film.

Figure 4:
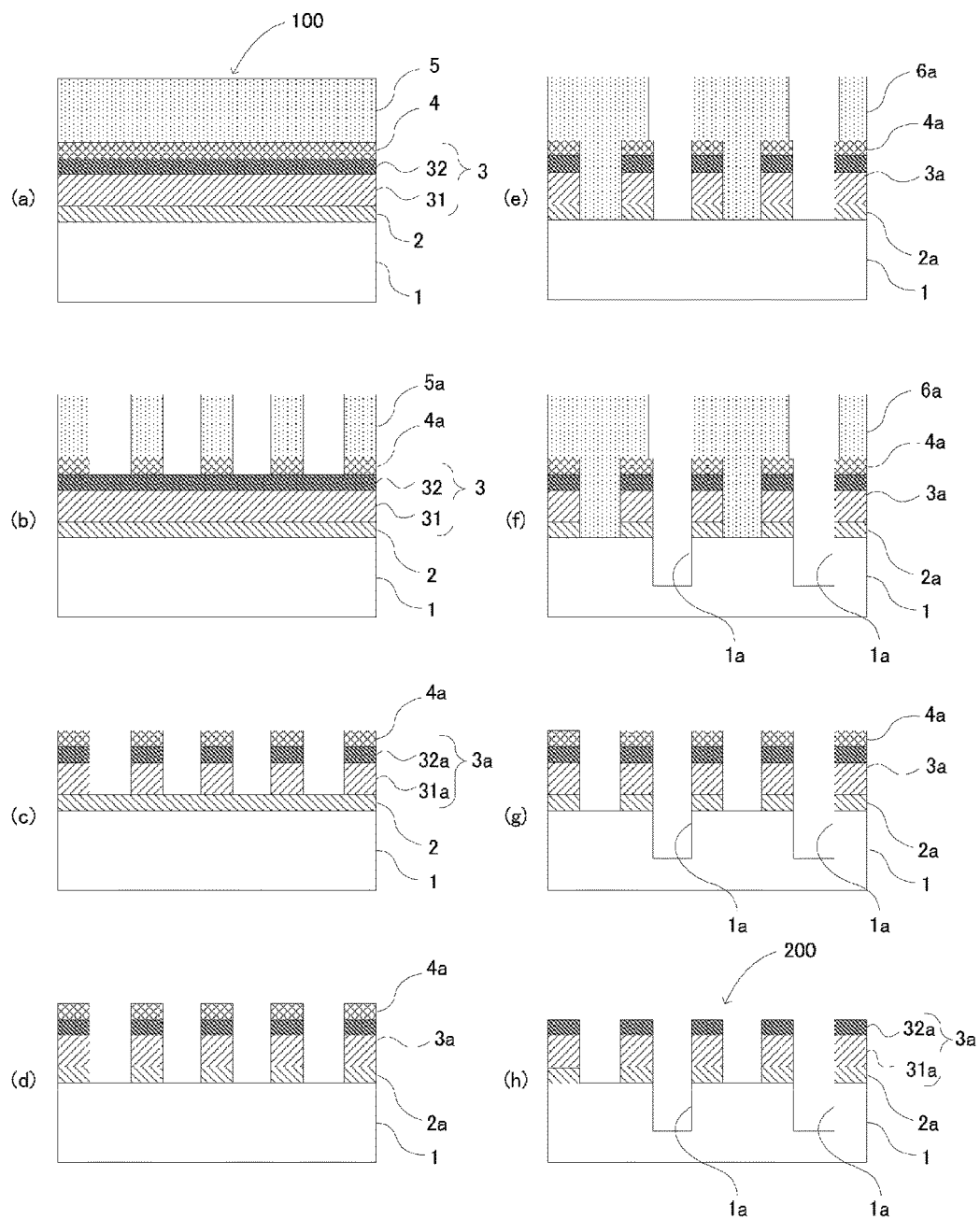
FIG. 4 depicts cross-sectional views showing steps for manufacturing a phase shift mask of the substrate-engraved type according to an embodiment of the present invention.

The present invention also provides a method of manufacturing a phase shift mask of the substrate-engraved type. FIG. 4 depicts cross-sectional views showing the steps for manufacturing a phase shift mask of the substrate-engraved type. The following provides an explanation of a method of manufacturing a phase shift mask of the substrate-engraved type according to the present invention in accordance with the manufacturing steps shown in FIG. 4. Details regarding the configuration of the mask blank 100 used in the present invention are as previously described.

First, a resist film 5 (see FIG. 4(a)) is formed on the mask blank 100. The thickness of the resist film 5 is required to be less than 150 nm, and is preferably not more than 120 nm and more preferably not more than 100 nm. Next, exposure drawing of a fine pattern to be formed on the thin film 3 is carried out on the resist film 5 formed on the mask blank 100 followed by carrying out developing treatment to form a resist pattern 5a. Next, using this resist pattern 5a as a mask, dry etching is carried out on the etching mask film 4 using a mixed gas of a chlorine-based gas and oxygen gas to form an etching mask pattern 4a (see FIG. 4(b)). Examples of chlorine-based gases used in this dry etching include $Cl_2$, $SiCl_4$, $CHCl_3$, $CH_2Cl_2$, $CCl_4$ and $BCl_3$. Continuing, the remaining resist pattern 5a is removed.

Next, using the etching mask pattern 4a as a mask, dry etching is carried out using a fluorine-based gas on the thin film 3 (upper layer 32 and lower layer 31, with an oxidized layer 33 (not shown) further contained in the upper layer 32) to form a thin film pattern 3a (upper layer pattern 32a and lower layer pattern 31a). At this time, since the etching stopper film 2 is hardly etched at all, the surface of the transparent substrate 1 can be protected. This is because the etching stopper film 2 is formed from a material that contains chromium and oxygen that are resistant to etching with a fluorine-based gas. Furthermore, examples of fluorine-based gases used in this dry etching include $CHF_3$, $CF_4$, $C_2F_6$, $C_4F_8$ and $SF_6$ (see FIG. 4(c)).

Next, using the etching mask pattern 4a as a mask, dry etching is carried out on the etching stopper film 2 using a chlorine-based gas not containing oxygen to form an etching stopper pattern 2a (see FIG. 4(d)). At this time, a fine pattern can be etched on the etching stopper film 2 and an adequate etching rate can be obtained even by dry etching with a chlorine-based gas only. This is because the etching stopper film 2 is formed from a material that contains chromium and oxygen in which the oxygen content is more than 50 at %. On the other hand, although the etching mask pattern 4a is formed from a material that contains chromium in the same manner as the etching stopper film 2, the oxygen content is low at 30 at %. Consequently, the etching rate during dry etching with chlorine-based gas only decreases considerably, thereby allowing the obtaining of adequate etching selectivity between the etching mask pattern 4a and the etching stopper film 2.

Next, a resist film 6 is formed on the mask blank on which the etching mask pattern 4a, the thin film pattern 3a and the etching stopper pattern 2a have been formed. Exposure drawing of a substrate-engraved pattern (phase shift pattern) for forming a substrate-engraved portion (phase shift portion) is carried out on the resist film 6 followed by carrying out developing treatment to form a resist pattern 6a (see FIG. 4(e)). As was previously described, a wide space is formed on the resist pattern 6a in anticipation of a margin slightly wider than the inherent width of the substrate-engraved portion in consideration of factors such as drawing accuracy. As a result, surfaces in the vicinity of the edges of the etching mask pattern 4a are in an exposed state.

Next, using this resist pattern 6a as a mask, dry etching is carried out on the transparent substrate 1 using a fluorine-based gas to engrave the transparent substrate 1 to a prescribed depth. As a result, a substrate-engraved portion 1a is formed in the transparent substrate 1 (see FIG. 4(f)). At this time, since the etching mask pattern 4a is formed from a material that contains chromium at not less than 45 at %, it has sufficiently high resistance to dry etching with fluorine-based gas. Consequently, even when dry etching for engraving the transparent substrate 1 has been completed, the vicinity of the pattern edges of the etching mask pattern 4a, which are exposed without being protected by the resist pattern 6a, remain. Accordingly, the thin film pattern 3a can be protected from dry etching with fluorine-based gas.

Next, the resist pattern 6a is removed (see FIG. 4(g)). Continuing, the etching mask pattern 4a is removed by dry etching using, for example, a mixed gas of chlorine-based gas and oxygen gas. Subsequently, a phase shift mask 200 of substrate-engraved type is obtained by carrying out prescribed cleaning treatment and the like (see FIG. 4(h)).

On the other hand, in another embodiment of the present invention, the etching stopper film 2 of the aforementioned mask blank 100 may be formed with a material that contains tantalum (Ta) and one or more elements selected from hafnium (Hf) and zirconium (Zr), and is substantially free of oxygen. Since the etching stopper film 2 made of these materials allows the obtaining of a high etching rate, it allows the formation of a fine pattern by dry etching with a chlorine-based gas that does not contain oxygen. In addition, the etching stopper film 2 made of these materials also demonstrates high resistance to dry etching with fluorine-based gas. Accordingly, when dry etching is carried out to form a pattern on the thin film 3, the etching stopper film 2 is hardly etched at all, thereby enabling the surface of the transparent substrate 1 to be protected.

Examples of materials containing tantalum and at least one element selected from hafnium and zirconium and are substantially free of oxygen include tantalum-hafnium alloy, tantalum-zirconium alloy, tantalum-hafnium-zirconium alloy and compounds of these alloys containing elements other than oxygen. The material of the etching stopper film 2 of this embodiment may contain elements such as nitrogen (N), carbon (C), hydrogen (H) or boron (B). In addition, the etching stopper film 2 may also be formed with a material that contains an inert gas such as helium (He), argon (Ar), krypton (Kr) or xenon (Xe). Furthermore, if the material of the etching stopper film 2 of this embodiment contains oxygen, the etching rate with respect to chlorine-based gas not containing oxygen decreases considerably. Consequently, the oxygen content in the etching stopper film 2 of this embodiment is required to be no more than the level of a contaminant present during deposition (not more than 5 at %), and is preferably not contained at all.

EXAMPLES

The following provides a more detailed explanation of embodiments of the present invention through examples thereof.

Example 1

A transparent substrate 1 composed of synthetic quart glass having main surface dimensions of about 152 mm×about 152 mm and having a thickness of about 6.25 mm was prepared. This transparent substrate 1 was polished so that the edge faces and main surface had a prescribed surface roughness, after which it was subjected to prescribed cleaning treatment and drying treatment.

Next, the transparent substrate 1 was placed in a single-wafer DC sputtering apparatus, and a chromium target was used to form an etching stopper film 2 made of chromium and oxygen (CrO film, Cr: 45.5 at %, O: 54.5 at %) at a film thickness of 5 nm to be contacted with the surface of the transparent substrate 1 by reactive sputtering (DC sputtering) in a mixed gas atmosphere of argon (Ar), oxygen ($O_2$) and helium (He). Furthermore, the composition of the etching stopper film 2 was determined by carrying out an auger electron spectroscopic (AES) analysis on a sample deposited with a CrO film using the same procedure.

Next, the transparent substrate 1 having the etching stopper film 2 formed on the surface thereof was placed in a single-wafer DC sputtering apparatus, and the lower layer 31 of the thin film 3 made of molybdenum, silicon and nitrogen (MoSiN film) was formed on the etching stopper film 2 at a film thickness of 47 nm by reactive sputtering (DC sputtering) in a mixed gas atmosphere of argon (Ar) and nitrogen ($N_2$) using a mixed target of molybdenum (Mo) and silicon (Si) (Mo:Si ratio=13 at %:87 at %). Continuing, the upper layer 32 of the thin film 3 made of molybdenum, silicon and nitrogen (MoSiN film) was formed at a film thickness of 4 nm on the lower layer 31 by reactive sputtering (DC sputtering) in a mixed gas atmosphere of argon (Ar) and nitrogen ($N_2$) using the mixed target of molybdenum (Mo) and silicon (Si) (Mo:Si ratio=13 at %:87 at %). Furthermore, the laminated structure having the etching stopper film 2 and the thin film 3 satisfied the condition of optical density of not less than 3.0 at the wavelength of an ArF excimer laser (about 193 nm).

Next, heat treatment (annealing treatment) was carried out for 30 minutes at 350° C. on the transparent substrate 1 provided with the thin film 3, followed by carrying out treatment for reducing the film stress of the thin film 3. Furthermore, a transparent substrate 1 provided with the thin film 3 was fabricated using the same procedure after undergoing annealing treatment and analyzed by X-ray photoelectron spectroscopy (ESCA) (however, analytical values were corrected for RBS, and to apply similarly hereinafter). As a result, the composition of the film was confirmed to consist of the lower layer 31 (Mo: 9.2 at %, Si: 68.3 at %, N: 22.5 at %) and upper layer 32 in the vicinity of the lower layer 31 side (Mo: 5.8 at %, Si: 64.4 at %, N: 27.7 at %, O: 2.1 at %). Furthermore, according to the results of analyzing the surface layer (oxidized layer) 33 of the upper layer 32 by X-ray photoelectron spectroscopy (ESCA), the molybdenum content was 3.4 at %, the silicon content was 43.9 at %, the nitrogen content was 14.6 at % and the oxygen content was 38.1 at %.

Next, the substrate 1 was placed in a single-wafer DC sputtering apparatus, and a chromium target was used to form the etching mask film 4 made of chromium and nitrogen (CrN film, Cr: 75 at %, N: 16 at %, O: 9 at %) at a thickness of 10 nm to be contacted with the surface of the upper layer 32 of the thin film 3 by reactive sputtering (DC sputtering) in a mixed gas atmosphere of argon (Ar) and nitrogen ($N_2$). Moreover, the stress of the etching mask film 4 was adjusted to be as low as possible (and preferably reduced substantially to zero) without having an effect on the film stress of the thin film 3 by annealing the etching mask film 4 at a temperature lower than the annealing treatment carried out on the thin film 3. Furthermore, the composition of the aforementioned etching mask film 4 was determined by carrying out auger electron spectroscopic (AES) analysis on a sample obtained by depositing a CrN film using the same procedure followed by carrying out annealing treatment. Consequently, oxidation was determined to have proceeded to a greater degree than immediately after deposition. The mask blank 100 of Example 1 was obtained according to the above procedure.

Next, using this mask blank 100, a Levenson-type phase shift mask of the substrate-engraved type was fabricated in accordance with the steps shown in the aforementioned FIG. 4. First, a chemically amplified positive resist film 5 for electron beam drawing (PRL009, Fujifilm Electronic Materials Co., Ltd.) was formed as a resist film on the mask blank 100 (see FIG. 4(a)). The resist film 5 was formed by spin-coating using a spinner (spin coating apparatus). After coating the aforementioned resist film 5, prescribed heating and drying treatment were carried out. The film thickness of the resist film 5 was 100 nm.

Next, a transfer pattern (pattern to be formed on the thin film 3) comprising an SRAF pattern having a line width of 50 nm was drawn on the resist film 5 formed on the aforementioned mask blank 100 using an electron beam drawing apparatus followed by developing with a prescribed developer to form a resist pattern 5a. Next, using the resist pattern 5a as a mask, dry etching was carried out on the etching mask film 4 using a mixed gas of $Cl_2$ and $O_2$ (flow rate ratio $Cl_2:O_2=4:1$, to apply similarly hereinafter) to form the etching mask pattern 4a (see FIG. 4(*b*)). Next, the remaining resist pattern 5a was stripped.

Next, using the etching mask pattern 4a as a mask, dry etching was carried out on the thin film 3 (upper layer 32 and lower layer 31) using a mixed gas of $SF_6$ and He to form the thin film pattern 3a (upper layer pattern 32a and lower layer pattern 31a) (see FIG. 4(*c*)). Continuing, using the etching mask pattern 4a as a mask, dry etching was carried out on the etching stopper film 2 using $Cl_2$ gas to form the etching stopper pattern 2a (see FIG. 4(*d*)).

Next, the resist film 6 was formed on the mask blank having the etching mask pattern 4a, the thin film pattern 3a and the etching stopper pattern 2a formed thereon. Exposure drawing of a substrate-engraved pattern (phase shift pattern) for forming a substrate-engraved portion (phase shift portion) was carried out on this resist film 6 followed by carrying out developing treatment to form the resist pattern 6a (see FIG. 4(*e*)). A wide space was formed on the resist pattern 6a in anticipation of a margin slightly wider than the inherent width of the substrate-engraved portion in consideration of factors such as drawing accuracy. As a result, surfaces in the vicinity of the edges of the etching mask pattern 4a were in an exposed state.

Next, using this resist pattern 6a as a mask, dry etching was carried out on the transparent substrate 1 using a fluorine-based gas to engrave the transparent substrate 1 to a prescribed depth and form the substrate-engraved portion 1a (see FIG. 4(*f*)). At this time, etching time was adjusted so that the engraved depth of the substrate was 173 nm. Next, the resist pattern 6a was removed (see FIG. 4(*g*)). Continuing, the etching mask pattern 4a was removed by dry etching using a mixed gas of $Cl_2$ and $O_2$ followed by carrying out a prescribed cleaning treatment to obtain the phase shift mask 200 of substrate-engraved type (see FIG. 4(*h*)).

The phase shift mask 200 obtained in this manner had a pattern composed of a laminated structure having the etching stopper pattern 2a and the thin film pattern 3a, and both were formed with favorable pattern accuracy. There was no particular etching damage observed in the pattern edges of the thin film pattern 3a. In addition, a phase shift mask fabricated in the same manner for evaluation purposes was fractured in order to confirm the cross-sectional shape of the substrate-engraved portion (phase shift pattern) la formed on the transparent substrate 1. When the pattern cross-section was observed with a transmission electron microscope (TEM), the difference in substrate thickness between the engraved portion and the non-engraved portion was confirmed to be accurately controlled to a prescribed value and pattern depth was confirmed to be uniform.

Next, a step for exposing and transferring a transfer pattern to a resist film on a transfer target in the form of a semiconductor wafer was carried out using the resulting Levenson-type phase shift mask 200. An immersion-type apparatus using an ArF excimer laser for the light source and annular illumination was used for the exposure apparatus. More specifically, the Levenson-type phase shift mask 200 of Example 1 was placed on the mask stage of the exposure apparatus followed by carrying out an exposure and transfer of the resist film for ArF immersion exposure on the semiconductor wafer. Prescribed developing treatment was then carried out on the resist film following exposure to form a resist pattern. Moreover, a circuit pattern was formed on the semiconductor wafer using the resist pattern. When the resulting circuit pattern on the semiconductor wafer was confirmed with a transmission electron microscope (TEM), the formed circuit pattern was determined to adequately satisfy the prescribed specifications.

Comparative Example 1

A mask blank of Comparative Example 1 was fabricated using the same procedure as Example 1 with the exception of using a CrOCN film (Cr: 48.9 at %, O: 26.4 at %, C: 10.6 at %, N: 14.1 at %) for the material used to form the etching stopper film and the etching mask film. Moreover, a Levenson-type phase shift mask of the substrate-engraved type was attempted to be fabricated using the mask blank of Comparative Example 1 according to the same process as Example 1. However, although it was barely possible to form the etching stopper pattern 2a by using the etching mask pattern as a mask and carrying out dry etching using $Cl_2$ gas on the etching stopper film, the film thickness of the etching mask pattern decreased considerably at that time. This was due to the etching rate during dry etching of the etching stopper film using $Cl_2$ gas being considerably smaller than that of the etching stopper film 2 of Example 1.

Since the film thickness of the etching mask pattern decreased considerably, the pattern edges of the etching mask pattern not protected by the resist pattern ended up being lost during the course of forming the substrate-engraved portion during subsequent dry etching with fluorine-based gas in order to form the substrate-engraved portion on the transparent substrate. Accompanying this, the pattern edges of the thin film also ended up being etched. Consequently, the resulting Levenson-type phase shift mask of the substrate-engraved type of Comparative Example 1 exhibited missing edge portions in the thin film pattern.

A step for exposing and transferring a transfer pattern to a resist film on a transfer target in the form of a semiconductor wafer was carried out in the same manner as Example 1 using this Levenson-type phase shift mask of Comparative Example 1. When the resulting circuit pattern on the semiconductor wafer was confirmed with a transmission electron microscope (TEM), numerous short-circuits and disconnections were observed in the Line and Space pattern in particular, and the formed circuit pattern did not satisfy the prescribed specifications.

BRIEF DESCRIPTION OF THE REFERENCE SYMBOLS

1 Transparent substrate
2 Etching stopper film
3 Thin film for pattern formation
31 Lower layer
32 Upper layer
33 Oxidized layer, highly oxidized layer
4 Etching mask film
5,6 Resist film
100 Mask blank
200 Phase shift mask

The invention claimed is:

1. A mask blank having a structure in which an etching stopper film, a thin film and an etching mask film are laminated on a transparent substrate in this order,
   wherein the etching stopper film is made of a material containing chromium and oxygen and the content of oxygen therein is more than 50 at %,
   the thin film is made of a material containing silicon or a material containing tantalum, and
   the etching mask film is made of a material containing chromium, the content of chromium therein is not less than 45 at % and less than 90 at %, and the content of oxygen therein is not more than 30 at %.

2. The mask blank according to claim 1, wherein the thin film is made of a material that can be dry-etched by a fluorine-based gas.

3. The mask blank according to claim 1, wherein the etching stopper film is made of a material that can be dry-etched by a chlorine-based gas that does not contain oxygen.

4. The mask blank according to claim 1, wherein the thin film is made of a material containing a transition metal and silicon.

5. The mask blank according to claim 4, wherein the thin film has an oxidized layer formed as the surface layer of the thin film, that is placed on a side opposite to the transparent substrate wherein the transition metal content is not more than 4 at % and the oxygen content is not less than 30 at %.

6. The mask blank according to claim 4, wherein the thin film has a laminated structure having a lower layer and an upper layer, and the total content of nitrogen and oxygen in the upper layer is greater than the total content of nitrogen and oxygen in the lower layer.

7. The mask blank according to claim 6, wherein the upper layer has an oxidized layer formed as the surface layer of the thin film, that is placed on a side opposite to the lower layer wherein the transition metal content is not more than 4 at % and the oxygen content is not less than 30 at %.

8. The mask blank according to claim 1, wherein the thin film is made of a material containing tantalum.

9. The mask blank according to claim 8, wherein the thin film has a highly oxidized layer having an oxygen content of not less than 60 at % formed as the surface layer of the thin film, that is placed on a side opposite to the transparent substrate.

10. The mask blank according to claim 1, wherein a resist film having a thickness of less than 150 nm is provided on the etching mask film.

11. The mask blank according to claim 1, wherein the thickness of the etching stopper film is not less than 3 nm and not more than 10 nm.

12. The mask blank according to claim 1, wherein the thickness of the etching mask film is not less than 3 nm and not more than 15 nm.

13. The mask blank according to claim 1, wherein the thickness of the thin film is not more than 60 nm.

14. The mask blank according to claim 1, having a laminated structure having the thin film and the etching stopper film, wherein the optical density relative to ArF exposure light is not less than 2.8.

15. A method of manufacturing a phase shift mask using the mask blank according to claim 1, comprising the steps of:
    forming a resist pattern on the etching mask film,
    forming an etching mask pattern by dry etching the etching mask film using a mixed gas of a chlorine-based gas and oxygen gas and using the resist pattern as a mask,
    removing the resist pattern,
    forming a thin film pattern by dry etching the thin film using a fluorine-based gas and using the etching mask pattern as a mask,
    forming an etching stopper pattern by dry etching the etching stopper film using a chlorine-based gas that does not contain oxygen gas and using the etching mask pattern as a mask, and
    removing the etching mask pattern.

16. The method of manufacturing a phase shift mask according to claim 15, wherein the step of removing the etching mask pattern is carried out by dry etching using a mixed gas of a chlorine-based gas and oxygen gas.

* * * * *